United States Patent
Den Otter

(10) Patent No.: US 7,235,432 B2
(45) Date of Patent: Jun. 26, 2007

(54) METHOD FOR PRODUCING AN ELECTRICAL CONDUCTOR ELEMENT

(75) Inventor: Johannes Marinus Jacobus Den Otter, Rosmalen (NL)

(73) Assignee: Tyco Electronics Nederland B.V. (NL)

( * ) Notice: Subject to any disclaimer, the term of this patent is extended or adjusted under 35 U.S.C. 154(b) by 263 days.

(21) Appl. No.: 10/922,360

(22) Filed: Aug. 20, 2004

(65) Prior Publication Data
US 2005/0076499 A1  Apr. 14, 2005

(30) Foreign Application Priority Data
Aug. 22, 2003  (EP) .................................. 03019030

(51) Int. Cl.
*H01L 21/50* (2006.01)
(52) U.S. Cl. ........................ 438/126; 438/127
(58) Field of Classification Search ................ 438/126, 438/127
See application file for complete search history.

(56) References Cited

U.S. PATENT DOCUMENTS

| | | | |
|---|---|---|---|
| 4,147,740 A | 4/1979 | Swiger et al. | |
| 6,218,203 B1 | 4/2001 | Khoury et al. | |
| 2002/0031905 A1 | 3/2002 | Beroz | |
| 2006/0060981 A1* | 3/2006 | Paulus ........................ 257/778 |

FOREIGN PATENT DOCUMENTS

| | | | |
|---|---|---|---|
| EP | 1246308 A2 | 10/2002 | |
| EP | 1246308 A3 | 8/2003 | |

* cited by examiner

*Primary Examiner*—Ngân V. Ngô
(74) *Attorney, Agent, or Firm*—Barley Snyder LLC

(57) ABSTRACT

The present invention relates to a method for producing an electrical conductor element with a housing and a conductor element, whereby the housing is made by a molding process and the conductor is embedded in the housing, whereby the conductor is produced by an electroforming process on a metallic layer. The conductor and the metallic layer are covered with the housing by a molding process, and the metallic layer is removed from the conductor and the molding housing. This method advantageously combines the well known molding process and the well known electroforming process for providing a reliable process for producing an electrical conductor element.

8 Claims, 2 Drawing Sheets

METHOD FOR PRODUCING AN ELECTRICAL CONDUCTOR ELEMENT

FIELD OF THE INVENTION

The invention pertains to a method of producing an electrical conductor element and to an electrical conductor element produced by a molding process.

BACKGROUND OF THE INVENTION

Using a three-dimensional injection-molding process, it is possible to produce a three-dimensional injection-molding conductor support in which conductors are embedded directly into a three-dimensional housing. By this method several layers of conductors can be encapsulated within a housing. The conductors may be arranged on the surface of the housing which extend into three spatial directions.

An electrical conductor element can, however, be produced by manufacturing a plastic foil and depositing a conductor trace on the plastic foil, for example by a screen-printing process. Subsequently, the plastic foil is thermoformed and the backside of the thermoformed foil is overmolding by a thicker layer providing the stability for a three-dimensional conductor element.

It is also known in the state of the art to deposit a circuit structure on a carrier film. A work piece is produced on the carrier film by a molding process. After the molding process, the carrier film is removed from the work piece. The work piece with the circuit structure constitutes an electrical conductor element with a housing.

It is also known in the state of the art to produce a conductor by an electroplating or an electroforming process.

European patent application EP 1 246 308 A2 describes a pair of electrical conductors using resin solder in one conductor. The electrical conductor comprises a first housing which is made of a synthetic resin and a first terminal which has a contacting part and a connecting part, both being exposed on the surface of the first housing. A second electrical conductor comprises a second housing which is made of an insulating material, and a second terminal which is made of a conductive material of which the elasticity is higher than of the material of the first conductor.

U.S. Pat. No. 4,147,740 describes a process for fabricating conductive patterns having sub-half micron dimensions. A mask and a lithographic process is disclosed for the formation of conductive patterns on substrates, particularly connection with the formation of high-electromobility transistors and metal semiconductor field effect transistors. The technique allows the formation of sub-half micron conductive patterns on semiconductor substrates using optical lithography and a multilayer portable conformable mask. The method includes the application of optical contact lithography to a conventional photoresist followed by a deep UV-flood exposure of an underlying multilayer portion. Metal is deposited on a semiconductor substrate through the mask formed by the photoresist and the underlying multilayer to produce sub-half micron conductive patterns.

U.S. Pat. No. 6,218,203 B1 describes a method of producing a contact structure for achieving an electrical connection with a contact target. The contact structure includes a contactor formed on a planar surface of a substrate by means of a micro-fabrication technology. In one aspect, the production method involves a plastic molding technology. In another aspect, the production method involves a photolithography technology using a grey-tone photomask. The contactor has at least a horizontal portion formed on the substrate and a contact portion formed on one end of the horizontal portion. A spring force of the horizontal portion of the contactor provides a contact force when the contactor is pressed against the contact target. In a further aspect, the contact structure includes a recess for providing a free space for the contactor when the contactor is pressed against the contact target.

US patent application publication US 2002/0031905 A1 describes a method of producing a connection component. The method provides a movable layer having first and second surfaces and forming vias at spaced-apart first locations of a removable layer. A conductive material, such as copper, is deposited over the first surface of the removable layer and in each of the vias to form one or more flexible leads including projections which downwardly extend to the wires towards the removable layer. Each lead includes a first end integrally connected to one of the projections and a second end. A substrate is provided over the conductive material. The removable layer is removed so that the first and the second ends of the leads can be moved away from each other. As a result, at least first or second ends of the leads are connected to the substrate without using a bonding or welding step.

It is an object of the invention to provide a simple and relatively inexpensive method of producing an electrical conductor element.

SUMMARY OF THE INVENTION

This and other objects of the invention are achieved by an embodiment of the process, wherein the metallic layer is covered with a photoresist layer. The photoresist layer is structured with a pattern of the conductor. The structured photoresist layer is used as a mask for forming a conductor by an electroforming process of the metallic layer. Using the photoresist layer as a mask for the electroforming process results in a simple and relatively inexpensive process.

After forming the conductor by means of the electroforming process, the photoresist layer is removed and the conductor element and the surface of the metallic layer is covered with a molding material by a molding process. After molding the housing, the metallic layer is removed by an etching process.

In another embodiment of the invention, the conductor is formed with a smaller face upon the metallic layer and with a broader face with a shoulder upon the photoresist layer.

BRIEF DESCRIPTION OF THE DRAWINGS

The invention will now be described by way of example with reference to the accompanying Figures of which.

DETAILED DESCRIPTION OF THE INVENTION

The invention is explained in grater detail with reference to the Figures. FIGS. 1 to 8 show different steps of the production process for producing an electrical connection element with a housing and a conductor embedded therein.

Figure 1:
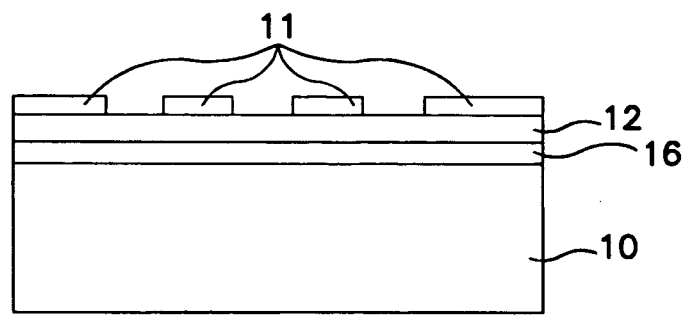
FIG. 1 is a sectional view showing the first step in a process for producing an electrical connection element.
Figure 2:
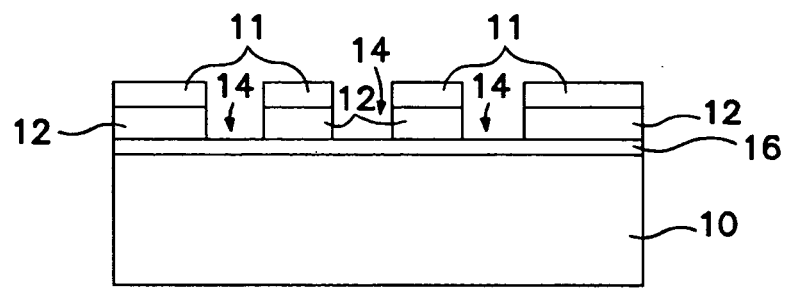
FIG. 2 is a cross sectional view showing a subsequent step in the process wherein a photoresist layer is removed.

FIG. 1 shows a sectional view of a metallic layer 10 that is covered with a top layer 16. An aluminium foil is preferably used for the metallic layer 10. The thickness of the aluminium foil may vary between 50 and 100 µm. The top layer 16 may be a copper layer with a thickness between 1 and 10 µm. On the top layer 16 a photoresist layer 12 is deposited. The photoresist layer 12 is covered with a photomask layer 11. The photoresist layer 12 is structured using the photomask layer 11 according to a pattern of a conductor. For this purpose, the photoresist layer 12 is removed in the given pattern from the metallic layer 10 as shown in FIG. 2. Recesses 14 of the photoresist layer 12 have the shape of the conductor 13. Then the photomask layer 11 is removed from the photoresist layer 12.

Figure 3:
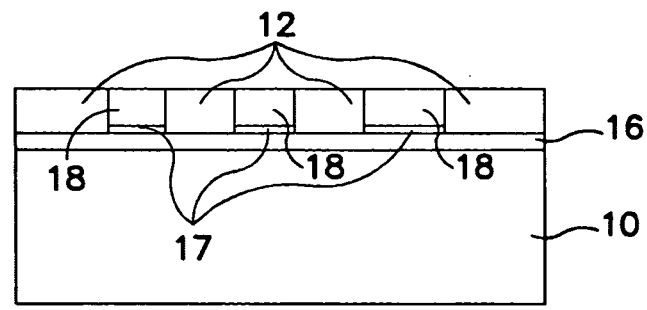
FIG. 3 is cross sectional view showing a further step in the process wherein a starting layer is deposited.
Figure 4:
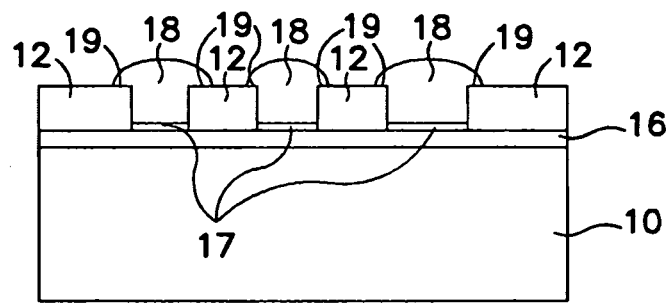
FIG. 4 is cross sectional view of a further step in the process wherein a filling layer is deposited.

After this step, a starting layer 17 made of nickel is deposited by an electroforming process on the free surface of the top layer 16. The starting layer may have a thickness of about 2 to 8 µm. Then a filling layer 18 is deposited on the starting layer 17 by means of an electroforming process. The filling layer 18 may be made of copper and have a plane end face to the photoresist layer 12. The starting layer 17 and the filling layer 18 constitute the conductor 13 that are shaped as lines. This is shown in FIG. 3. In a preferred embodiment of the invention, the metallic layer of these conductors 13 is made for example of an aluminium or copper or a combination of a aluminium/copper layer.

In a preferred embodiment, the filling layer 18 is deposited with shoulders 19 that are arranged on the surface of the photoresist layer 12. The filling layer 18 may take a mushroom like shape as shown in the cross-sectional view of FIG. 4.

The filling layer 18 is deposited in the recesses 14 of the photoresist layer 12. By depositing, material is also deposited onto the surface of the photoresist layer 12 at the border of the recesses 14. Therefore, shoulders 19 of the conductor 13 are arranged on the photoresist layer 12.

Figure 5:
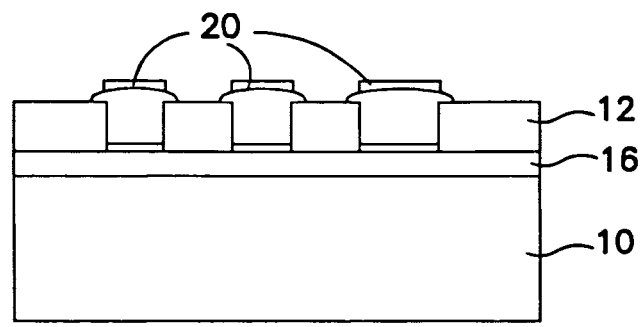
FIG. 5 is cross sectional view showing a further step in the process wherein a second top layer is applied.

In a preferred embodiment of the invention, a second top layer 20 is deposited on the top of the filling layer 18 as shown in FIG. 5. The second top layer 20 is made of an alloy of nickel and gold by a plating process or is made of a tin layer produced by an immersion process.

Figure 6:
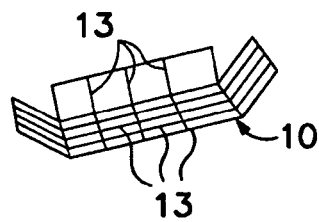
FIG. 6 is a perspective view of a flexible circuit film formed according to the invention.

In a preferred embodiment of the invention, the metallic layer with the conductors 13 constitutes a flexible circuit film. The flexible circuit film may be cut and/or formed in three spatial directions, as shown in FIG. 6.

Figure 7:
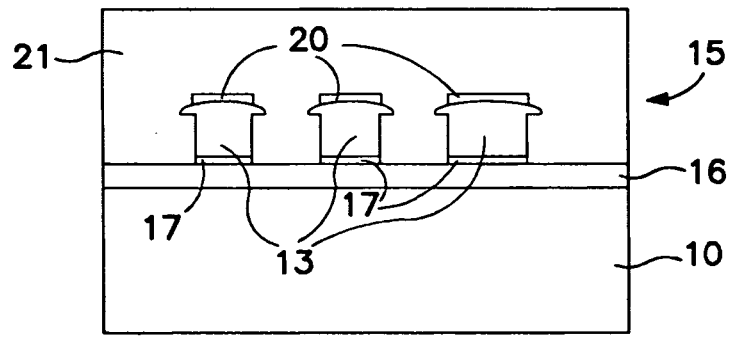
FIG. 7 is a cross sectional view showing a further step wherein molding of a housing over the conductors is shown.

After this, the photoresist layer 12 is removed for example by an etching process and the conductors 13 and the free surfaces of the metallic layer 10 are covered by a molding process with a molding material 21. For example, a plastic compound may be used as a molding material. The molding material constitutes a housing 15 in which the conductors 13 are embedded. This process step is shown in FIG. 7.

Figure 8:
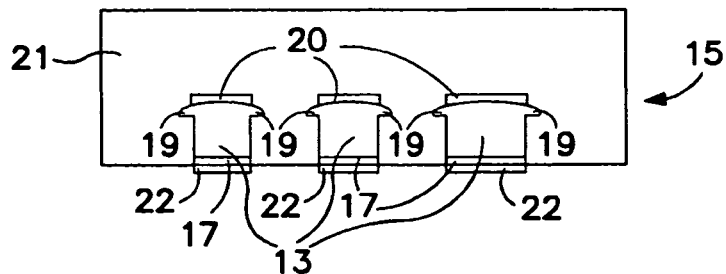
FIG. 8 is a cross sectional view showing a further step of the process wherein the metallic layer is removed.

Afterwards, the metallic layer 10 is removed from the conductors 13 and the top layer 16 is removed by an etching process. In a following step, the top layer 16 is removed and the starting layer 17 is covered with a third top layer 22. The third top layer 22 is produced by the same process and the same material as the second top layer 20. This process step is shown in FIG. 8. The housing could have the shape of a small plate so that the housing constitutes an electrically isolated layer that could be formed by a subsequent forming process to create a three-dimensional molding interconnect device. The process could be used for producing an electrical conductor element, for example a coaxial conductor for mobile phones. The coax conductor could be used as a switching coax conductor for mobile phones used for testing and for car kit applications. The switching function of the coax conductor may be used for transmitting the signal from an internal phone antenna of the mobile phone to an external car antenna.

An advantage of the invention is to use a combination of the electroforming process and the molding process to produce an electrical conductor element with an embedded conductor. The advantage of the process according to the claimed invention is that the two processes are well-known and could be advantageously combined to a new process which allows for a relatively inexpensive and reliable production for an electrical conductor element with an embedded conductor. Additionally, the particular shape of the conductor having a shoulder has the advantage that the conductor is assuredly affixed in the housing by the shoulder.

I claim:

1. A method for producing an electrical conductor element being embedded in a housing comprising:
   producing the conductor by an electroforming process on a top layer which covers a metallic layer;
   covering the conductor and the top layer with the housing by a molding process; and,
   removing the top layer and the metallic layer from the conductor and the housing.

2. The method according to claim 1, wherein the top layer is covered with a photoresist layer, a pattern of the conductor is removed from the photoresist layer, and the structured photoresist layer is used as a mask for depositing the conductor by the electroforming process on the top layer.

3. The method according to claim 2, wherein the photoresist layer is removed from the surface of the top layer, the conductor and the surface of the top layer is covered with plastic material by a molding process and the top layer and the metallic layer are removed by an etching process.

4. The method according to claim 1, wherein the conductor is deposited in recesses of the photoresist such that a shoulder is formed upon the photoresist layer.

5. The method according to claim 1, wherein the metallic layer is made of an aluminium foil.

6. The method according to claim 1, wherein the top layer is at least partially constructed of copper.

7. The method according to claim 1, wherein a metallic staffing layer is produced by the electroforming process and that on the starting layer a filling layer is deposited for producing the conductor.

8. The method according to claim 1, wherein on the top and/or on the bottom of the conductor a second or a third top layer, respectively, is deposited.

* * * * *